United States Patent [19]

Koyama

[11] Patent Number: 4,910,478
[45] Date of Patent: Mar. 20, 1990

[54] AMPLIFIER CIRCUIT AND METHOD OF CONTROLLING OUTPUT POWER THEREOF

[75] Inventor: Masaharu Koyama, Itami, Japan

[73] Assignee: Mitsubishi Denki Kabushiki Kaisha, Tokyo, Japan

[21] Appl. No.: 300,945

[22] Filed: Jan. 24, 1989

[30] Foreign Application Priority Data

Jun. 10, 1988 [JP] Japan .................. 63-144332

[51] Int. Cl.$^4$ ............................................. H03G 3/00
[52] U.S. Cl. .......................................... 330/278; 330/51
[58] Field of Search ................ 330/51, 129, 151, 278; 455/232, 250, 73, 89

[56] References Cited

U.S. PATENT DOCUMENTS

| | | | |
|---|---|---|---|
| 3,636,463 | 1/1972 | Ongkiehong | 330/278 |
| 3,919,685 | 11/1975 | Haill | 330/51 X |
| 4,357,577 | 11/1982 | Smither | 330/51 |
| 4,598,252 | 7/1986 | Andricos | 330/51 |

FOREIGN PATENT DOCUMENTS

| | | | |
|---|---|---|---|
| 90610 | 7/1981 | Japan | 330/51 |
| 90611 | 7/1981 | Japan | 330/51 |
| 90612 | 7/1981 | Japan | 330/51 |
| 61-137410 | 6/1986 | Japan | . |
| 62-81804 | 4/1987 | Japan | . |
| 62-82705 | 4/1987 | Japan | . |

Primary Examiner—James B. Mullins
Attorney, Agent, or Firm—Oblon, Spivak, McClelland, Maier & Neustadt

[57] ABSTRACT

A multistage amplifier (1) consists of unit amplifiers (1a–1c) connected in series. A λ/2 strip line (20) is connected in parallel to the last stage unit amplifier (1c), so that a signal may bypass the last stage unit amplifier. When the last stage unit amplifier is disenabled, the signal bypasses the last stage unit amplifier, and the output power is reduced without a decrease of power efficiency in the other unit amplifiers. When all of the unit amplifiers are enabled and the strip line is grounded at the central point thereof, the output power is increased.

12 Claims, 4 Drawing Sheets (PRIOR ART)

AMPLIFIER CIRCUIT AND METHOD OF CONTROLLING OUTPUT POWER THEREOF

BACKGROUND OF THE INVENTION

1. Field of the Invention

The present invention relates to an amplifier circuit, and more particularly, to a technique for controlling the output power of a high-frequency amplifier circuit.

2. Description of the Background Arts

In an amplifier circuit employed in the transmitter output stage of a transceiver or the like, a high-frequency signal is amplified with a multistage amplifier, whereby a high power output signal is obtained. However, when the distance from the transceiver to the opposite transceiver of the radio base station is relatively short, for example, the communication with the opposite transceiver or the radio station can be attained even with a relatively low power radio signal. Therefore, an amplifier circuit of variable output power type is also developed and used in the transceiver, in which the output power can be switched between high power and low power.

FIG. 10 shows a conventional amplifier circuit of the variable output power type, which is provided in the output stage of a transceiver. The amplifier circuit is provided with a multistage amplifier 1 having a plurality of unit amplifiers 1a-1c connected in series. A high-frequency input signal SI supplied to an input terminal 3 is amplified with the multistage amplifier 1 thereby to become a high-frequency amplified output signal SO. The high-frequency signal SO is delivered to a load circuit 4 through an output terminal 3. DC powers for driving the unit amplifiers 1a-1c is supplied from a DC power source 5 through power input terminals 6a-6c, respectively, where an electronic variable resistor 7 is inserted between the power source 5 and the initial stage unit amplifier 1a. The electronic variable resistor 7 is so constructed that the equivalent internal resistance thereof is varied according to the level of a resistance control signal $S_R$.

When it is intended that the power of the output signal SO is varied, the equivalent internal resistance of the electronic variable resistor 7 is changed by changing the level of the resistance control signal $S_R$. Accordingly, the DC bias power supplied to the initial stage unit amplifier 1a is changed, and the gain in the initial stage unit amplifier 1a is changed. As a result, the total gain in the multistage amplifier 1 is changed and the power of the output signal SO supplied to the load circuit 4 through the output terminal 3 is changed.

Each of the unit amplifiers 1a-1c is so designed as to amplify its input signal at the maximum efficiency when the multistage amplifier circuit 1 generates a high power output signal. In other words, an impedance matching circuit (not shown) included in each of the unit amplifier 1a-1c is so constructed that optimum impedance matching is attained at a high power operation of the multistage amplifier 1.

Therefore, when the gain in the initial stage unit amplifier 1a is reduced, a transistor (not shown) operating for power amplification in the initial stage unit amplifier 1a is changed in its equivalent impedance, and the impedance matching with the second stage unit amplifier 1b comes off. The impedance matching between the second and last stage unit amplifiers 1b and 1c comes also off, because the level of the input signal for the second stage unit amplifier 1b is shifted from the optimum input level thereof. Thus, if the power of the output signal SO is reduced by decreasing the DC power supplied to the initial stage unit amplifier 1a, the total power efficiency in the multistage amplifier 1 is reduced.

The decrease in the power efficiency is serious in a portable transceiver in which the DC power source 5 is a battery. This is because the power demand does not decrease in proportion to the decrease of the output signal power, and therefore, the lifetime of the battery is not improved, even if the output signal power is reduced for power saving.

SUMMARY OF THE INVENTION

The present invention is intended for an amplifier circuit for amplifying an input signal to generate an amplified signal which can be switched between in high power and low power.

According to the present invention, the amplifier circuit comprises: (a) a multistage amplifier having unit amplifiers connected in series for amplifying the input signal to generate the amplified signal, wherein the unit amplifiers have respective optimum input levels which are different from each other, and the unit amplifiers are classified into an input side unit amplifier and an output side unit amplifier in accordance with a connection order of said unit amplifiers, (b) a bypass circuit coupled in a parallel to the input side unit amplifier to form a parallel circuit of the output side unit amplifier and the bypass circuit so that an output signal of the input side unit amplifier may bypass the output side unit amplifier; and (c) a switching circuit coupled to the parallel circuit for selectively enabling the output side unit amplifier and the bypass circuit in response to a switching signal supplied from the exterior of the amplifier circuit.

In a preferred embodiment, the input signal is a high-frequency input signal having a frequency belonging to VHF band or UHF band, and the bypass circuit has a strip line.

Preferably, the strip line has an electric line length of $(N\lambda/2)$, where $\lambda$ is a wavelength of the input signal and N is a positive integer.

The parallel circuit has a first branch circuit including the output side unit amplifier, and a second branch circuit including the strip line. The switching signal has a first switching signal supplied from the exterior of the amplifier circuit and a second switching signal synchronized with the first switching signal.

The switching circuit may have: (c-1) a first switching circuit coupled to the first branch circuit to electrically close/open the first branch circuit in response to the first switching signal, and (c-2) a second switching circuit inserted between a grounded level point and an intermediate point of the strip line to electrically connect/disconnect the intermediate point with/from the grounded level point in response to said second switching signal. The intermediate point exists at a position apart from an end point of the strip line by an electric line length of $[(2M-1)\lambda/4]$ along the strip line, where M is an integer satisfying a condition of $1 \leq M \leq N$.

Since the input side unit amplifier operates in its optimum input level regardless of the output power level of the amplifier circuit, the output power level can be varied or controlled without a decrease in the power efficiency.

The present invention is also intended for a method of controlling an output power of an amplifier circuit having a multistage amplifier in which unit amplifiers are connected in series, the unit amplifiers having different optimum input levels, respectively. According to the present invention, the method comprises the steps of: (a) classifying the unit amplifiers into an input side unit amplifier and an output side unit amplifier in accordance with a connection order of the unit amplifiers, (b) preparing a bypass circuit and connecting the bypass circuit to the output side unit amplifier in parallel so that the output side unit amplifier may be bypassed, (c) selectively enabling the output side unit amplifier and the bypass circuit according to a power level required in a load circuit to which an output signal of the multistage amplifier is to be delivered, and (d) supplying an input signal to the multistage amplifier so that the input signal is amplified in the multistage amplifier to generate the output signal delivered to the load circuit.

Accordingly, an object of the present invention is to provide an amplifier circuit having a multistage amplifier in which the output power thereof can be varied or controlling without a decrease of the power efficiency therein.

Another object of the present invention is to provide a method of controlling the output power of the amplifier circuit without a decrease of the power efficiency therein.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
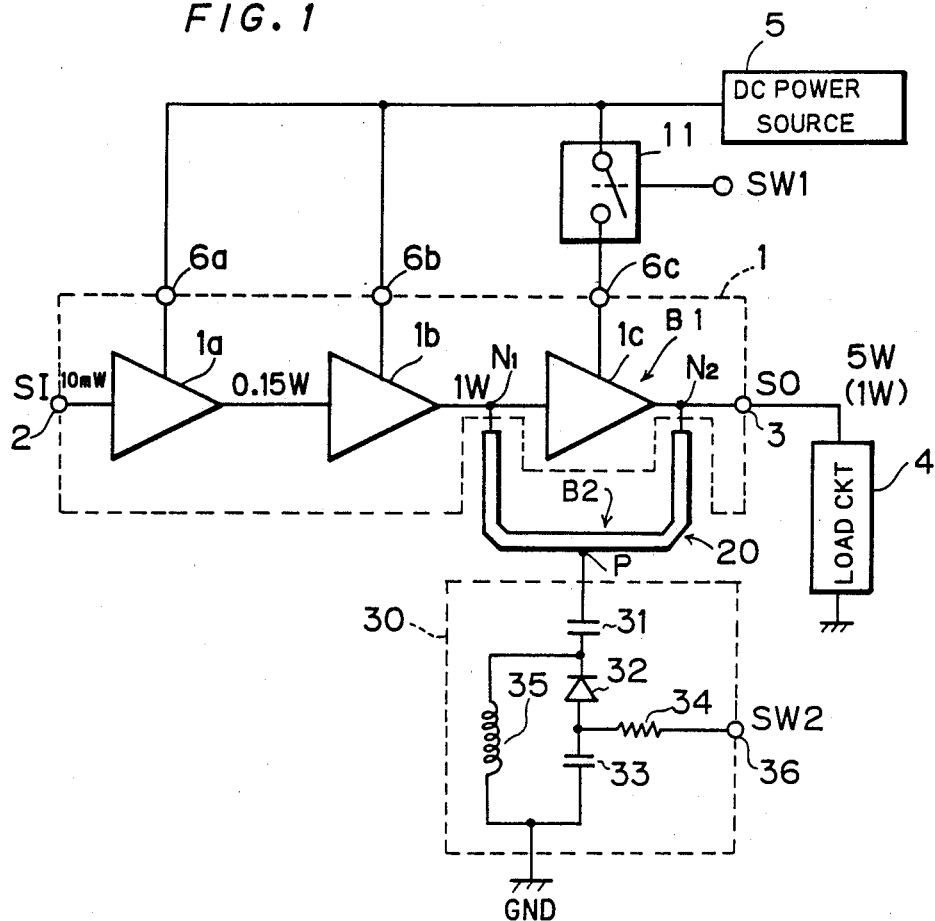
FIG. 1 is a block diagram showing a first embodiment of the present invention.

FIG. 1 is a block diagram showing a first embodiment of the present invention, which is embodied as a high-frequency power-variable amplifier circuit employed in a transceiver (e.g., a portable transceiver). The amplifier circuit has a multistage amplifier 1 in which three unit amplifiers 1a–1c are connected in series. A high-frequency input signal SI is supplied to an input terminal 2. In the preferred embodiment, the input signal SI has a frequency belonging to VHF band or UHF band. The input signal SI is amplified by the multistage amplifier 1, and then delivered to a load circuit 4 through an output terminal 3 as a high-frequency output signal SO.

A DC power source 5 is provided for supplying a DC drive power to the multistage amplifier 1, and it may be a battery. With respect to the initial stage unit amplifier 1a and the second stage unit amplifier 1b, DC power delivered from the DC power source 5 is directly supplied to the unit amplifiers 1a and 1b through power input terminals 6a and 6b, respectively. On the other hand, a switching circuit 11 is inserted between the DC power source 5 and the power input terminal 6c for the last stage unit amplifier 1c. The switching circuit 11 is operable to open and close the power supply path from the DC power source 5 to the last stage unit amplifier 1c, in response to a switching signal SW1. In the preferred embodiment, the switching circuit 11 is so constructed as to close the power supply path when the switching signal SW1 is in a high level. The unit amplifiers 1a–1c connected in series are classified into "an input side unit amplifier" and "an output side unit amplifier" in accordance with the connection order of the unit amplifiers 1a–1c. In the embodiment shown in FIG. 1, the classification boundary is supposed between the second stage unit amplifier 1b and the last stage unit amplifier 1c, and therefore, the unit amplifiers 1a and 1b are classified as "input side unit amplifiers" and the last unit amplifier 1c is classified as "an output side unit amplifier".

Figure 2:
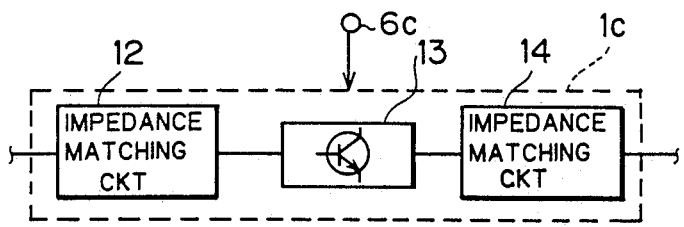
FIG. 2 is a block diagram showing the internal structure of an unit amplifier.

The internal structure of the last stage unit amplifier 1c is shown in FIG. 2, and those of the other unit amplifier 1a and 1b are similar to the structure shown in FIG. 2. The unit amplifier 1c consists of an input impedance matching circuit 12, an amplifier element 13, and an output impedance matching circuit 14. The impedance matching circuits 12 and 14 are provided in order to attain the impedance matching between the unit amplifier 1c and the circuits connected therewith. Although the impedance matching circuits 12 and 14 are individually provided in each unit amplifier in FIG. 2, the impedance matching circuits to be adjacent to each other in the series connection of the unit amplifiers 1a–1c may be combined to form a combined impedance matching circuit.

The amplifier element 13 includes a transistor, for example, and it is biased by the DC power supplied through the power terminal 6c. Therefore, when the supply of the DC power is stopped, the amplifier element 13 is disenabled working, and the signal transmission from the input impedance matching circuit 12 to the output impedance matching circuit 14 through the amplifier element 13 is also disenabled or stopped. In other words, the transmittance through the unit amplifier 1c is disenabled according to the stop of the DC power supply thereto.

Now back to FIG. 1, a strip line 20 is connected with the last stage unit amplifier 1c in parallel at nodes $N_1$ and $N_2$, whereby a parallel circuit consisting of the last stage input amplifier 1c and strip line 20 is formed. The strip line 20 has an electrical line length of $\lambda/2$, where $\lambda$ is the wavelength of the input signal SO. As will be understood from the following description, the strip line 20 functions as a bypass line through which the high-frequency signal bypasses the last stage unit amplifier 1c. In other words, the parallel circuit has a first branch circuit B1 including the last stage unit amplifier 1c and a second branch circuit B2 including the strip line 20.

A switching circuit 30 is inserted between a ground level GND and the central point P of the strip line 20, the central point P being apart from the terminal point of the strip line 20 by an electrical line length of $\lambda/4$ along the strip line 20. The switching circuit 30 has a parallel circuit in which a high frequency switching diode 32 and a radio frequency choke coil (RFC) 35 are connected in parallel to each other, the RFC 35 being provided for DC bias of the diode 32. The high frequency switching diode 32 may be a PIN diode, for example.

In the cathode side and the anode side of the diode 32, DC blocking capacitors 31 and 33 are provided, respectively. A resistance 34 is inserted between a switching signal input terminal 36 and the node at which the diode 32 and the capacitor 33 are coupled with each other. A switching signal SW2 is supplied to the terminal 36. The switching signal SW2 may be obtained from the output of the switching circuit 11 which is provided for controlling the power supplied to the last stage unit amplifier 1c through the terminal 6c.

The high-frequency amplifier circuit shown in FIG. 1 is constructed in the form of a hybrid integrated circuit. For clear understanding of the character of the embodiment, the following description will be given with respect to an example in which several electrical parameters have respective specific values. The optimum input power levels of the unit amplifiers 1a–1c are set at 10 mW, 0.15 W and 1 W, respectively, while the optimum output power levels of the unit amplifiers 1a–1c are set at 0.15 W, 1 W and 5 W, respectively. The input impedance of the load circuit 4 is set at 50 Ω. Further, the multistage amplifier 1 is so designed that the power of the output signal SO is 5 W when all of the unit amplifiers 1a–1c are enabled working. The output impedance of the last stage unit amplifier 1c is so set as to be 50 Ω when the input power thereto is at 1 W. Similarly, the output impedances of the other unit amplifiers 1a and 1c are so set as to be at 50 Ω when their inputs have the respective optimum power levels.

When it is desired that the output signal SO of the high-frequency amplifier circuit is set at a high power level, the switching signal SW1 set at a high level is supplied to the switching circuit 11. Accordingly, the switching circuit 11 closes the power path from the DC power source 5 to the last stage unit amplifier 1c, and the last stage unit amplifier 1c is enabled, so that the signal path through the unit amplifier 1c is closed.

The other switching signal SW2 is also set at a high level synchronously with the switching signal SW1, so that the diode 32 is forward biased to be in an on-state. The DC bias current after passing through the diode 32 flows to the ground GND through the RFC 35. The value of the DC bias current is set at a predetermined value with the resistance 34.

Figure 3:
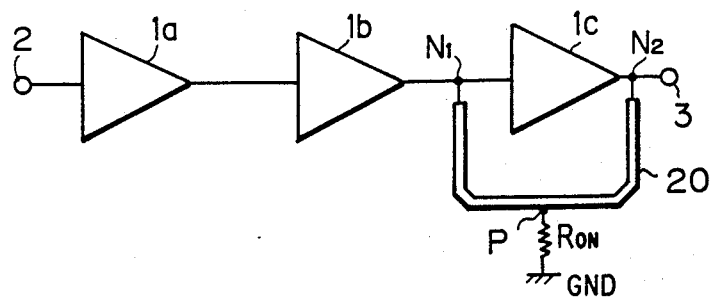
FIG. 3 and FIG. 4 are equivalent circuit diagrams of a switching circuit in a high power operation and a low power operation, respectively.

Since the diode 32 is in its on-state, the equivalent circuit of the switching circuit 30 for a high-frequency signal, which is illustrated in FIG. 3, substantially has only an equivalent internal forward resistance $R_{ON}$ in the diode 32. When the characteristic impedance of the strip line 20 is expressed as $Z_0$, the sending-end impedance $Z_{in}$ at the sending-end $N_1$ of the strip line 20 can be expressed as:

$$Z_{in} = Z_0^2 / R_{ON} \tag{1}$$

from the known formula for a λ/4 strip line, since the electric line length between the sending-end $N_1$ and the central point P is λ/4. The forward resistance of a PN or PIN junction diode is considerably small, and therefore, the value of $R_{ON}$ is considerable small. Accordingly, the sending-end impedance $Z_{in}$ in the expression (1) is extremely large or substantially infinite.

In other words, the second branch circuit B2 is equivalently opened or disenabled for a high-frequency signal, and the input signal SI is amplified by all of the unit amplifiers 1a–1c. As a result of the three stage amplification, the output signal SO has a high power of 5 W.

On the other hand, when it is desired to reduce the power of the output signal SO, both of the switching signals SW1 and SW2 are set at a low level, i.e., a zero level or a negative level. Accordingly, the switching circuit 11 open the power supply path to the last stage unit amplifier 1c, and the power supply to the last stage unit amplifier 1c is stopped. Thus, the last stage unit amplifier 1c is disenabled and the first branch circuit B1 is opened or disenabled.

Figure 4:
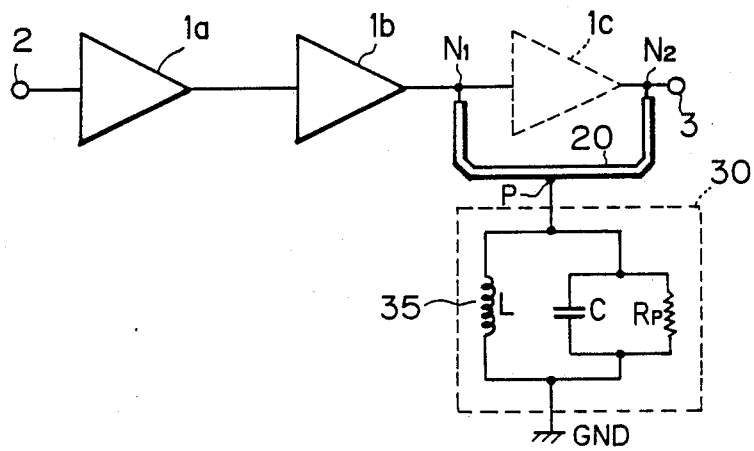

Since the switching signal SW2 is at the low level, the diode 32 is turned off. When the equivalent internal resistance and the equivalent internal capacitance of the diode 32 being in its off state are expressed as $R_P$ and C, respectively, the equivalent circuit of the switching circuit 30 being in its off state can be expressed as shown in FIG. 4. Since the respective capacitances of the DC blocking capacitors 31 and 33 shown in FIG. 1 are considerably larger than the equivalent interval capacitance of the diode 32, the capacitances of the diodes 31 and 33 are omitted in FIG. 4 in which the equivalent circuit for a high-frequency signal is illustrated.

As seen from FIG. 4, the resistance $R_P$, the inductance L of the RFC 34 and the capacitance C as combined with each other form a parallel circuit inserted between the point P and the ground GND. In the preferred embodiment, the value of the inductance L is so determined that the inductance L and the capacitance C satisfy the antiresonant condition:

$$\omega L = 1/\omega C \tag{2}$$

where ω is the angular frequency of the input signal SI.

Under the condition, the equivalent circuit of the switching circuit 30 is equivalently expressed only by the resistance $R_P$. Since the value of the equivalent resistance $R_P$ is considerably large, the electrical coupling between the central point P of the strip line 20 and the ground level GND is extremely weakened like an open-state. The current passing through the resistance $R_P$ is small, and power consumption in the switching circuit 30 is also small.

Since the coupling between the central point P and the ground level GND are substantially lost, the sending-end impedance $Z_{in}$ at the sending-end point $N_1$ does not depend upon the characteristic impedance $Z_0$ of the strip line 20, and it has a value equal to the impedance of the load circuit 4. This situation can be understood from the electric character of λ/2 strip line.

Under the circumstances, the input signal is serially amplified by the initial stage unit amplifier 1a and the second stage unit amplifier 1b, and then bypasses the last stage unit amplifier 1c by going through the strip line 20. As a result, the low power signal of 1 W delivered from the second stage unit amplifier 1b is supplied to the load circuit 4 through the output terminal 3.

Note that the initial stage unit amplifier 1a and the second stage unit amplifier 1b operate in their respective optimum input levels of 10 mW and 0.15 W, and their optimum output levels of 0.15 W and 1 W, respectively, even in the low power output operating mode of the multistage amplifier 1. Accordingly, the power efficiency in the unit amplifiers 1a and 1b is not decreased, even when the power of the output signal SO is decreased. Therefore, the power, that is, current consumption saving by disenabling the last stage unit amplifier 1c is attained, and the lifetime of the DC power source 5, e.g., a battery, is improved. Further, the output impedance of the second stage unit amplifier 1b which exists just before the bypass line 20 is matched with the load impedance of 50 Ω, and therefore, the impedance matching between the multistage amplifier 1 and the load circuit 4 is maintained even when the high-frequency signal bypasses the last stage unit amplifier 1c. Thus, the power loss due to an impedance mismatching is prevented, and the power is further saved.

Figure 5:
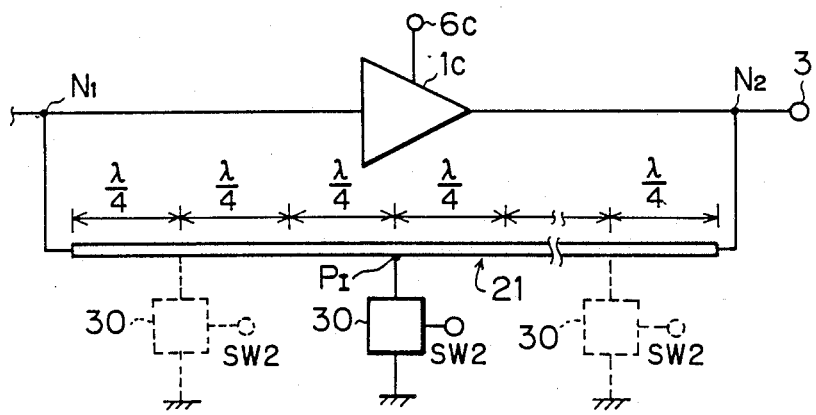
FIG. 5 is a partial diagram showing an amplifier circuit as a modification of the first embodiment.

In general, a strip line 21 (FIG. 5) having a line length of $(N\lambda/2)$ can be employed for the bypass line, where N is an arbitrary positive integer. In such a case, the switching circuit 30 is connected with the strip line 20 at the intermediate point $P_I$ apart from the terminal or end point of the strip line 21 by the electrical line length of $[(2M-1)\lambda/4]$, where M is an arbitrary positive integer satisfying the condition $1 \leq M \leq N$. When $N > 2$, since M satisfying the condition has multi-value, a plurality of intermediate points satisfying the condition exists, and the switching circuit 30 may be provided at one or more intermediate points. The case where all of the intermediate points are provided with the switching circuits 30, respectively, is illustrated in the FIG. 5 with a broken line.

When a plurality of the switching circuits 30 are coupled to the different intermediate points, respectively, the effect for disenabling the bypass line 20 is further emphasized. That is, since the impedance between respective ones of the intermediate points and the GND level becomes extremely small when the switching signal SW2 is at the high level, so that the resistance equivalently corresponding to the resistance $R_{ON}$ in the expression (1) becomes further small, and the sending-end impedance $Z_{in}$ at the sending-end point $N_1$ further increases to become substantially infinite.

Figure 6:
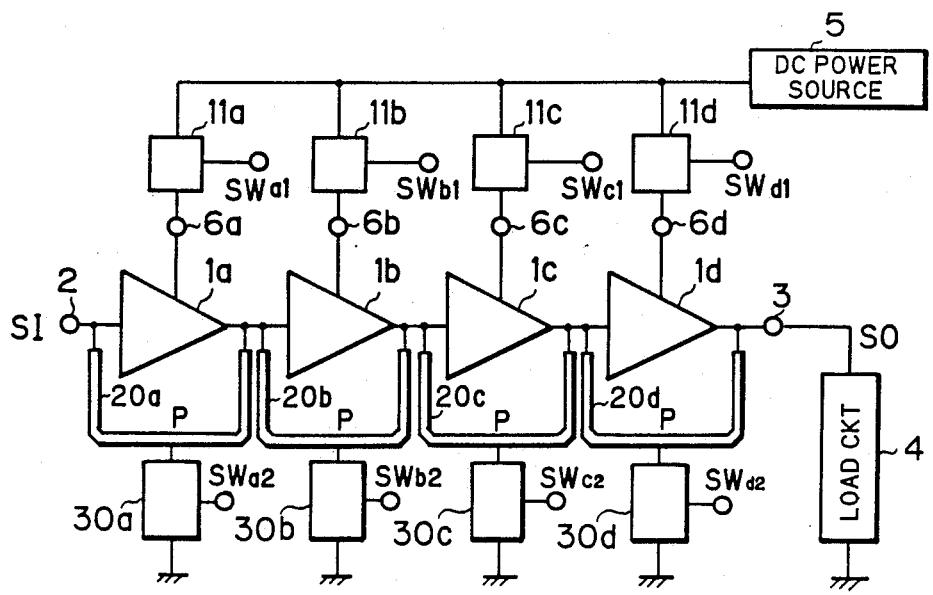
FIG. 6 is a block diagram showing a second embodiment of the present invention.

FIG. 6 shows a second embodiment of the present invention. In the second embodiment, the multi-stage amplifier circuit comprises a multistage connection of four unit amplifiers 1a-1d, whose respective optimum input levels are different from each other. Strip lines 20a-20d each having an electrical line length of $\lambda/2$ are connected with the unit amplifiers 1a-1d in parallel, respectively. In other words, parallel circuits each of which is formed by a parallel connection of one unit amplifier and one strip line are connected in series. Switching circuits 11a-11d and 30a-30d are also provided for all of the unit amplifiers 1a-1d, and the internal structures of the switching circuits 11a-11d and 30a-30d are the same as the switching circuits 11 and 30 in FIG. 1, respectively. The switching circuits 11a-11d are coupled with the unit amplifiers 1a-1d through power input terminals 6a-6d, respectively.

The two switching signals $SW_{a1}$ and $SW_{a2}$ included in the pair ($SW_{a1}$, $SW_{a2}$) are given to the switching circuits 11a and 30a, respectively, and the signals $SW_{a1}$ and $SW_{a2}$ are set at a high level or a low level while being synchronized with each other. Similarly, in each of the pairs of the switching signals ($SW_{b1}$, $SW_{b2}$), ($SW_{c1}$, $SW_{c2}$) and ($SW_{d1}$, $SW_{d2}$), the paired two signals are set at a high or low level while being synchronized with each other, but the switching signal levels can be independently controlled between the different pairs.

For example, when all of the eight switching signal $SW_{a1}$-$SW_{d1}$ and $SW_{a2}$-$SW_{d2}$ are set at the high level, the power of the output signal SO becomes the maximum value thereof. On the other hand, when only the switching signals ($SW_{d1}$, $SW_{d2}$) for the last stage unit amplifier 1d are set at the low level, only the last stage unit amplifier 1d is bypassed, so that the power of the output signal SO is reduced by the factor of the gain value in the last stage unit amplifier 1d. If two pairs of the switching signals ($SW_{c1}$, $SW_{c2}$) and ($SW_{d1}$, $SW_{d2}$) respectively given to the output side unit amplifiers 1c and 1d are set at the low level while the other switching signals ($SW_{a1}$, $SW_{a2}$) and ($SW_{b1}$, $SW_{b2}$) are at a high level, the power of the output signal SO is further decreased.

As understood from the above description, the power of the output signal SO obtained through the amplifier circuit shown in FIG. 6 can be reduced in stages, by serially setting the switching signals at a low level in the order from the last stage unit amplifier 1d to the initial stage unit amplifier 1a so that the high-frequency signal may bypass one or more unit amplifiers relatively close to the output terminal 3.

Regardless of the number of the bypassed unit amplifiers, all of the enabled unit amplifiers relatively close to the input terminal 2 operate in their respective optimum input levels and output levels, similarly to the first embodiment. All of the modifications explained for the first embodiment may be also applied to the second embodiment.

In order to attain an impedance matching with the load circuit 4, all of the respective output impedances of the unit amplifiers 1a-1d are set at the value being equal to the load impedance. As typically embodied in the second embodiment, the bypass line may be provided to the initial stage unit amplifier 1a and the intermediate stage unit amplifiers 1b and 1c, as well as the last stage unit amplifier 1d. The initial and intermediate stage unit amplifiers 1a-1c may be also bypassed under the condition where the last stage unit amplifier 1d is also bypassed. In other words, arbitrary number of the unit amplifiers close to the output terminal 3 may be bypassed.

Figure 7:
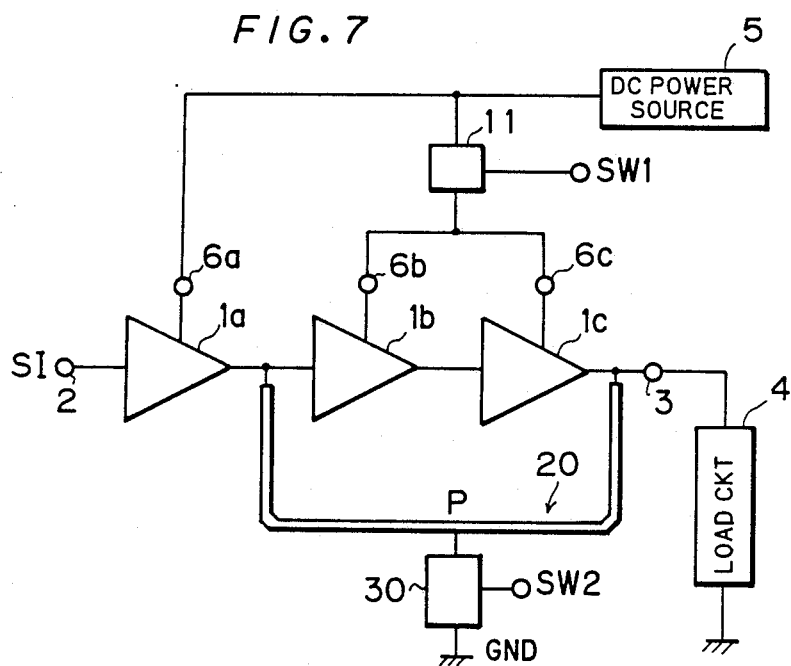
FIG. 7 is a block diagram showing a third embodiment of the present invention.

FIG. 7 shows a third embodiment of the present invention. In the third embodiment, a $\lambda/2$ strip line 20 is connected in parallel to the series connection of an intermediate stage unit amplifier 1b and a last stage unit amplifier 1c, where the initial stage unit amplifier 1a is classified as "an input side unit amplifier", and the other unit amplifiers 1b and 1c are classified as "output side unit amplifiers", with a classification boundary supposed between the unit amplifiers 1a and 1b. When the bypass line or the strip line 20 is enabled by setting the switching signal SW2 at a low level, both of the unit amplifiers 1b and 1c are disenabled since the switching signal SW1 is also set at a low level. In general, the bypass line may be connected in parallel to a series connection of arbitrary number of unit amplifiers.

Figure 8A:
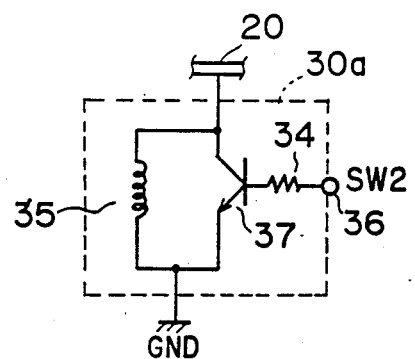
FIG. 8A and FIG. 8B are circuit diagrams showing other constructions of the switching circuit.
Figure 8B:
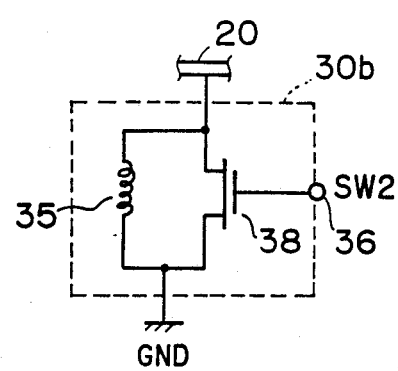

An other switching element than a diode may be employed in the switching circuit 30, in place of the diode 32. For example, a bipolar transistor 37 may be employed in a switching circuit 30a as shown in FIG. 8A, and an FET 38 may be employed in a switching circuit 30b (FIG. 8B), where the circuit 30a or 30b is used in place of the switching circuit 30. When the transistor 37 or 38 is employed, no DC blocking condenser is required, since no current flows from the switching signal input terminal 36 to the ground GND directly. Further, when the FET 38 is employed, no bias current due to the switching signal SW2 flows in the switching circuit 30b, and therefore, the resistance 34 employed in the switching circuit 30 for setting the bias current at a desired value is not required in the circuit 30b.

Figure 9:
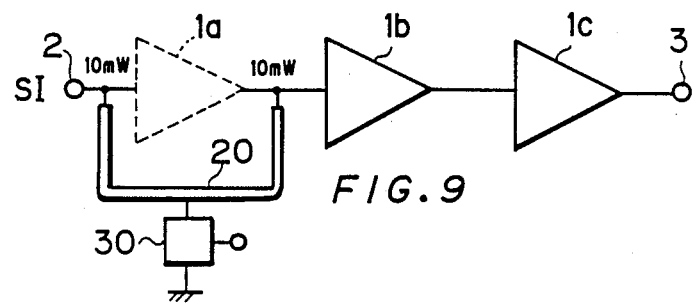
FIG. 9 is a partial block diagram showing an amplifier circuit to be compared with the present invention.
Figure 10:
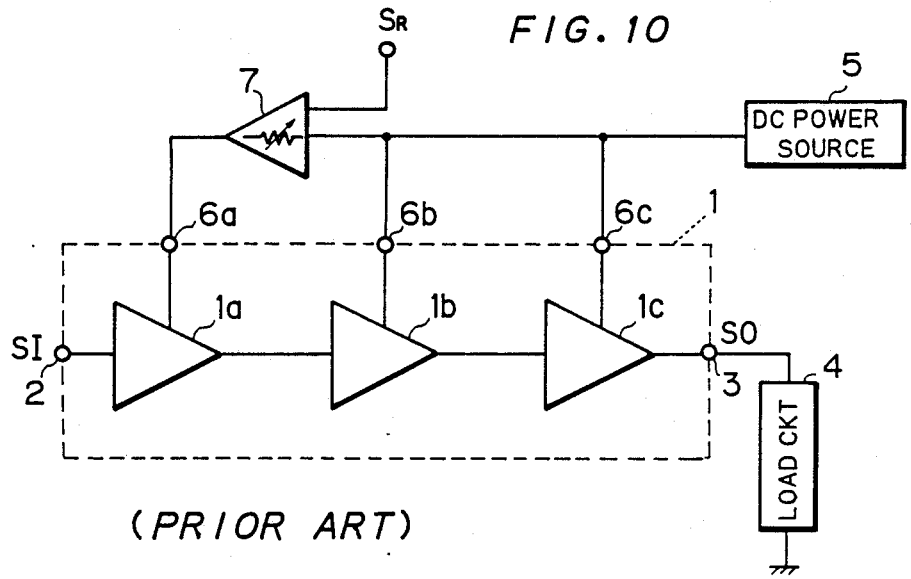
FIG. 10 is a block diagram showing a conventional amplifier circuit.

In order to clarify the character of the present invention where a bypass line is provided to at least one output side unit amplifier, an amplifier circuit to be compared with the present invention is illustrated in FIG. 9. In the amplifier circuit shown in FIG. 9, a strip line 20 is provided only to an initial stage unit amplifier 1a. When the initial stage unit amplifier 1a is disenabled and bypassed, the power of 10 mW supplied in the input signal SI is delivered to the second stage unit amplifier 1b without an amplification in the initial stage unit amplifier 1a. Accordingly, the power efficiency is reduced in the second stage unit amplifier 1b whose optimum input level is 0.15 W. Also in the last stage unit amplifier 1c, the power efficiency is reduced due to the reduction of the output power of the second stage unit amplifier 1b. From the above description, it will be understood that the amplifier circuit according to the present invention is superior to the amplifier circuit shown in FIG. 9, since the former provides a bypass line to the output side unit amplifier and the power efficiency is not reduced. Incidentally, it should be noted that the amplifier circuit shown in FIG. 9 is not a prior art, but an example provided for the comparison with the present invention.

The present invention can be applied to not only a high-frequency and high-power amplifier circuit constructed in the form of a hybrid integrated circuit, but also to other amplifier circuits.

Although the present invention has been described and illustrated in detail, it is clearly understood that the same is by way of illustration and example only and is not to be taken by way of limitation, the spirit and scope of the present invention being limited only by the terms of the appended claims.

I claim:

1. An amplifier circuit for amplifying an input signal of a high frequency belonging down into the VHF band to generate an amplified signal, comprising:
    a multistage amplifier having unit amplifiers connected to series for amplifying said input signal to generate said amplified signal, wherein said unit amplifiers have respective optimum input levels which are different from each other, and said unit amplifiers are classified into an input side unit amplifier and an output side unit amplifier in accordance with a connection order of said unit amplifiers;
    bypass means having a strip line with an electrical line length of $(N\lambda/2)$, where $\lambda$ is a wavelength of said input signal and N is a positive integer coupled in parallel to said output side unit amplifier to form a parallel circuit of said output side unit amplifier and said bypass means so that an output signal of said input side unit amplifier may bypass said output side unit amplifier; and
    switching means coupled to said parallel circuit for selectively enabling said output side unit amplifier and said bypass means in response to a switching signal supplied from the exterior of said amplifier circuit;
    wherein said parallel circuit has a first branch circuit including said output side unit amplifier, and a second branch circuit including said strip line, said switching signal has a first switching signal supplied from the exterior of said amplifier circuit and a second switching signal synchronized with said first switching signal, and
    wherein said switching means has,
        a first switching circuit coupled to said first branch circuit to electrically close/open said first branch circuit in response to said first switching signal, and
        a second switching circuit inserted between a grounded level point and an intermediate point on said strip line to electrically connect/disconnect said intermediate point with/from said grounded level point in response to said second switching signal, said intermediate point existing at a position apart from an end point of said strip line by an electrical line length of $[(2M-1)\lambda/4]$ along said strip line, where M is an integer satisfying a condition of $1 \leq M \leq N$.

2. An amplifier circuit in accordance with claim 1, wherein
    said second switching circuit has;
        an active switching element inserted between said intermediate point and said constant voltage level point, said second switching signal being supplied to said active switching element, and
        an inductor coupled in parallel to said active switching element, an inductance of said inductor being determined so that said inductance and an equivalent internal capacitance of said active switching element in an off-state satisfy an anti-resonant condition with respect to the frequency of said input signal.

3. An amplifier circuit in accordance with claim 2, wherein
    said amplifier circuit is prepared so as to be coupled to a load circuit having a predetermined load impedance, and
    each of said unit amplifiers has an output impedance matched with said load impedance.

4. An amplifier circuit in accordance with claim 3, wherein
    said integer N is larger than one, whereby said integer M satisfying said condition $1 \leq M \leq N$ has multi-values, and there exist a plurality of intermediate points on said strip line corresponding to said multi-values of said integer M, respectively,
    said switching means has a plurality of switching circuits each of which is constructed as said second switching circuit, and
    said plurality of switching circuits are inserted between respective ones of said intermediate points and said constant voltage level point, respectively.

5. An amplifier circuit in accordance with claim 3, wherein
    said first switching circuit is inserted in a power supply path provided between said output side unit amplifier and a power source for supplying an electric power from said power source to said output side unit amplifier, and
    said second switching signal is obtained from said first switching circuit.

6. An amplifier circuit in accordance with claim 3, wherein
    said multistage amplifier has greater than two unit amplifiers connected in series, and said strip line is coupled in parallel to a series connection of at least two of said unit amplifiers each of which is classified as said output side unit amplifier.

7. An amplifier circuit for amplifying a high-frequency input signal having a frequency belonging down to the VHF band, to generate an amplified signal, comprising:
a multistage amplifier having a series connection of parallel circuits each of which has an unit amplifier and a bypass circuit comprising a strip line with an electrical line length of ($N\lambda/2$), where $\lambda$ is a wavelength of said input signal and N is a positive integer connected in parallel for amplifying said high-frequency input signal to generate said amplified signal, an optimum input level of said unit amplifier being different in every parallel circuit,
switching circuits coupled to said parallel circuits, respectively, each of said switching circuits being operable to selectively enable said unit amplifier and said bypass circuit included in a corresponding parallel circuit in response to a switching signal supplied from the exterior of said amplifier circuit, and
output means coupled to said multistage amplifier for outputting said amplified signal to a load circuit without further amplifying said amplified signal;
wherein each of said parallel circuits has a first branch circuit including said unit amplifier, and a second branch circuit including said strip line,
said switching signal has a first switching signal supplied from the exterior of said amplifier circuit and a second switching signal synchronized with said first switching signal, and
wherein said switching means has,
a first switching circuit coupled to said first branch circuit to electrically close/open said first branch circuit in response to said first switching signal, and
a second switching circuit inserted between a grounded level point and an intermediate point on said strip line to electrically connect/disconnect said intermediate point with/from said grounded level point in response to said second switching signal, said intermediate point existing at a position apart from an end point of said strip line by an electrical line length of $[(2M-1)\lambda/4]$ along said strip line, where M is an integer satisfying a condition of $1 \leq M \leq N$.

8. A method of controlling an output power of an amplifier circuit having a multistage amplifier in which unit amplifiers are connected in series, said unit amplifiers having different optimum input levels, respectively, said method comprising the steps of:
classifying said unit amplifiers into an input side unit amplifier and an output side unit amplifier according to a connection order of said unit amplifiers;
preparing a bypass means having a strip line whose electrical line length is ($N\lambda/2$), where $\lambda$ is a wavelength of said input signal and N is a positive integer and connecting said bypass means to said output side unit amplifier in parallel so that said output side unit amplifier may be bypassed;
selectively enabling said output side unit amplifier and said bypass means according to a power level required in a load circuit to which an output signal of said multistage amplifier is to be delivered by electrically connecting a grounded level point and an intermediate point of said strip line when said bypass means is not to be enabled, said intermediate point existing at a position apart from an end point of said strip line by an electrical line length of $[(2M-1)\lambda/4]$ along said strip line, where M is an integer satisfying a condition of $1 \leq M \leq N$: and
supplying an input signal of a high frequency in the VHF band, to said multistage amplifier so that said input signal is amplified in said multistage amplifier to generate said output signal delivered to said load circuit.

9. A method in accordance with claim 8, further comprising the step of:
matching each of said unit amplifiers which has an output impedance with a load impedance in said load circuit.

10. A method in accordance with claim 9, further comprising the steps of:
enabling said output side unit amplifier when said power level required in said load circuit is a relatively high power level, so that said output power of said amplifier circuit is set at said high power level; and
substantially disconnecting said intermediate point, on said strip line from said grounded level point when said power level required in said load circuit is a relatively low power level, so that said input signal is amplified in said input side unit amplifier and then bypasses said output said unit amplifier through said strip line, to be delivered to said load circuit as said amplifier signal having said low power level.

11. A method in accordance with claim 10, further comprising the step of:
employing said amplifier circuit in a transceiver.

12. A method in accordance with claim 11, further comprising the steps of:
providing said transceiver with a battery; and
supplying electric power for driving said unit amplifiers from said battery.

* * * * *